(12) United States Patent
Lee

(10) Patent No.: US 7,119,557 B2
(45) Date of Patent: Oct. 10, 2006

(54) HOLLOW MICROPROBE USING A MEMS TECHNIQUE AND A METHOD OF MANUFACTURING THE SAME

(75) Inventor: Oug-Ki Lee, Seoul (KR)

(73) Assignee: Philcom Corporation, (KR)

( * ) Notice: Subject to any disclaimer, the term of this patent is extended or adjusted under 35 U.S.C. 154(b) by 14 days.

(21) Appl. No.: 10/527,359

(22) PCT Filed: Jul. 16, 2003

(86) PCT No.: PCT/KR03/01414

§ 371 (c)(1),
(2), (4) Date: Mar. 9, 2005

(87) PCT Pub. No.: WO2004/030080

PCT Pub. Date: Apr. 8, 2004

(65) Prior Publication Data

US 2006/0139038 A1    Jun. 29, 2006

(30) Foreign Application Priority Data

Sep. 25, 2002    (KR) ............... 10-2002-0058021

(51) Int. Cl.
*G01R 31/02* (2006.01)
*H01R 43/00* (2006.01)

(52) U.S. Cl. ............... 324/754; 324/761; 29/825
(58) Field of Classification Search ............... None
See application file for complete search history.

(56) References Cited

U.S. PATENT DOCUMENTS 5,166,520 A   11/1992   Prater et al.
5,512,838 A   4/1996   Roach (Continued)

FOREIGN PATENT DOCUMENTS

| JP | 11-218549 | 8/1999 |
|---|---|---|
| JP | 2000-046871 | 2/2000 |
| JP | 2000-171489 | 6/2000 |

OTHER PUBLICATIONS

Copy of PCT/KR03/01414 International Search Report.
Copy of PCT/KR2003/001414 International Preliminary Examination Report.

*Primary Examiner*—Paresh Patel
(74) *Attorney, Agent, or Firm*—Daly, Crowley, Mofford & Durkee, LLP

(57) ABSTRACT

The present invention relates to a hollow microprobe using an MEMS technique and a method of manufacturing the same. A method of manufacturing a hollow microprobe using an MEMS technique according to the present invention comprises: a step of forming a protection film pattern on a substrate; a step of forming a through hole on the substrate using the protection film pattern as a mask; a step of forming a seed layer on the upper portion of the protection film pattern of the substrate provided with the through hole and an inside wall of the through hole; a step of removing the seed layer of the upper portion of the substrate and the protection film to remain the seed layer only in the inside surface of the though hole, a step of forming a buried conductor within the through of the substrate by an electroplating method; a step of planarizing the top surface of the substrate provided with the buried conductor; a step of forming a base conductive film on the substrate which its top surface is planarized; a step of forming a first tip supporter on the substrate provided with the base conductive film and having a oblique surface sloping down; a step of rounding the top surface of the first tip supporter; a step of forming a second tip supporter; a step of forming a second tip supporter on the outside surface of the first tip supporter to open the top surface of the first tip supporter; a step of forming a conductive material tip on the outside surface of the second tip supporter; and a step of removing the top surface of the opened first tip supporter with a predetermined depth.

37 Claims, 8 Drawing Sheets

U.S. PATENT DOCUMENTS

| | | | |
|---|---|---|---|
| 6,027,951 A * | 2/2000 | MacDonald et al. | 438/20 |
| 6,310,483 B1 | 10/2001 | Taura et al. | |
| 6,504,151 B1 * | 1/2003 | Mitchell et al. | 250/306 |
| 6,852,968 B1 * | 2/2005 | Ouchi et al. | 250/234 |
| 6,891,360 B1 * | 5/2005 | Beaman et al. | 324/72.5 |
| 2006/0091510 A1 * | 5/2006 | Liu et al. | 257/678 |

* cited by examiner

HOLLOW MICROPROBE USING A MEMS TECHNIQUE AND A METHOD OF MANUFACTURING THE SAME

This application is a National Stage application under 35 U.S.C. §371 of and claims the benefit of International Application No. PCT/KR2003/001414, filed on Jul. 16, 2003, published in the English language on Apr. 8, 2004 as International Publication Number WO 2004/030080 A1, which claims priority to Korean Application No. 10-2002-0058021 filed on Sep. 25, 2002, all of which are hereby incorporated by reference.

TECHNICAL FIELD

The present invention relates to a hollow microprobe using an MEMS technique and a method of manufacturing the hollow microprobe, and more specifically to a hollow microprobe using an MEMS technique and a method of manufacturing the hollow microprobe, in which the microprobe for electrically testing a semiconductor chip can be manufactured using the MEMS technique. Description of the Prior Art

BACKGROUND ART

Generally, in semiconductor manufacturing processes, after wafer-manufacturing processes are finished, non-defective products are selected through a probing test and received in packages, thereby completing final products.

Next, a burn-in process is carried out to a semiconductor device packaged as the final product.

In such a probing test, predetermined electrical signals are applied from a tester through probes of a probe card contacted with electrode pads of a chip formed on a semiconductor substrate, and then the electrical signals responding to the applied electrical signals are received again by the tester, so that it is checked whether the chip formed on the semiconductor substrate is normal or not.

As described above, the probe card for testing the completed wafer, that is, a semiconductor chip comprises, as shown in FIG. 1, a printed circuit board 110 provided with circuits, a reinforcement plate 112 formed at a center of a top surface of the printed circuit board 110, a probes 114' contacted to the electrode pads of the wafer not shown, needles 14 connected to the circuits of the printed circuit board 110, a fixing plate 116 formed at a center of a bottom surface of the printed circuit board 110 to hold the probes 114', and fixing members 118 for fixing the probes 114' to the fixing plate 116.

At that time, a defined portion of the probe 114' is bent downwardly, that is, toward the electrode pad by a predetermined angle.

The probes 114' are contacted with central portions of the electrode pads with the probe card moving up down by mean of a jig not shown, so that it is checked whether the electrode pads are normal or not.

However, since the probes provided in the conventional probe card are a needle type and the defined portions of the probes are bent downwardly, that is toward the electrode pads by a predetermined angle, it is not easy to cope with the highly integrated semiconductor elements.

In other words, since the defined portion of the probes provided in the aforementioned probe card are bent downwardly, that is, toward the electrode pads by the predetermined angle, it is not possible to arrange the probes on the fixing plate of the probe card with high density, so that it is not possible to cope with the highly integrated semiconductor elements.

Further, since the needle type probes can slide on balltype electrode pads widely used in recent years, that is, the ball-type electrode pads of which top surfaces are protruded upwardly, it is not easy for the needle type probes to be in contact with the ball-type electrode pads.

In addition, since the needle-type probes are formed through processes such as cutting and grinding of needles by means of manual works, there are problems that mass-production thereof is limited and difference in characteristics of the completed probes is generated depending upon proficiencies of workers.

It is an object of the present invention to provide a hollow microprobe using an MEMS technique and a method of manufacturing the hollow microprobe, the hollow microprobe being vertically fixed to cope with a fine pitch of a highly integrated semiconductor element.

It is another object of the present invention to provide a hollow microprobe using an MEMS technique and a method of manufacturing the hollow microprobe, in which the microprobe can be easily in contact with a ball-type electrode pad.

It is still another object of the present invention to provide a hollow microprobe using an MEMS technique and a method of manufacturing the hollow microprobe, suitable for mass-producing reproducible products.

DISCLOSURE OF INVENTION

In order to accomplish the above objects of the present invention, a method of manufacturing a hollow microprobe using an MEMS technique according to the present invention comprises: a step of forming a protection film pattern on a substrate; a step of forming a through hole on the substrate using the protection film pattern as a mask; a step of forming a seed layer on the upper portion of the protection film pattern of the substrate provided with the through hole and an inside wall of the through hole; a step of removing the seed layer of the upper portion of the substrate and the protection film to remain the seed layer only in the inside surface of the though hole, a step of forming a buried conductor within the through of the substrate by an electroplating method; a step of planarizing the top surface of the substrate provided with the buried conductor; a step of forming a base conductive film on the substrate which its top surface is planarized; a step of forming a first tip supporter on the substrate provided with the base conductive film and having a oblique surface sloping down; a step of rounding the top surface of the first tip supporter; a step of forming a second tip supporter on the outside surface of the first tip supporter to open the top surface of the first tip supporter; a step of forming a conductive material tip on the outside surface of the second tip supporter; and a step of removing the top surface of the opened first tip supporter with a predetermined depth.

Now, the steps of the method for manufacturing a hollow microprobe using an Micro electro-mechanical systems (MEMS) technique according to the present invention will be described.

(1) Step of forming the protection film pattern

In this step, the protection film pattern is formed on the substrate. Specifically, the protection film made of photo-resist with a predetermined thickness is formed on the top surface of the substrate, and the protection film is exposed and developed, thereby forming the protective film pattern.

At that time, it is preferable that the substrate is 500 μm thick, and the photo-resist is 10±2 μm thick.

(2) Step of forming the through hole

In this step, the through hole is formed in the substrate using a laser process or a reactive ion etching (RIE) process. In the laser process, a laser beam is applied to the substrate to punch the substrate, and in RIE process, the substrate is dry-etched using the protection film pattern to form the through hole.

When the laser process is used, there is an advantage that the step of forming the protection film pattern is not needed, but there is a disadvantage that the individual step is required every through hole and thus the processing time is increased. Furthermore, when the RIE process is used, there is a disadvantage that the protection film pattern is formed using the photo-resist, but there is an advantage that a plurality of through holes are formed at one time.

Accordingly, when the number of the through holes to be formed is relatively small, it is effective to use the laser process, but when the number of the through holes is relatively large, it is effective to use the RIE process.

(3) Step of forming the seed layer

In this step, the seed layer is formed on a top surface of the substrate, and specifically is formed by depositing chrome (Cr) or copper (Cu) using a sputtering process.

(4) Step of removing the seed layer and the protection film

In this step, the seed layer and the protection film pattern being on the top surface of the substrate are removed using a wet etching process. Through this process, the seed layer remains only within the through hole formed in the substrate, and the seed layer and the protection film pattern except the through hole are removed.

However, if the laser process is used in the step of forming the through hole, the photo-resist pattern is not required, and as a result, the step of removing the photo-resist pattern is not required.

(5) Step of forming the buried conductor

In this step, the buried conductor is formed within the through hole provided in the substrate. Specifically, the buried conductor is formed within the through hole through the electroplate process using the seed layer as a seed for the electroplating. The buried conductor is made of nickel (Ni).

Furthermore, the step of forming the buried conductor can be carried out using an electroplating pad in addition to the seed layer. In other words, the electroplating process is performed after the electroplating pad is attached to one surface of the substrate, and the electroplate process is completed, and the electroplating pad is removed. At that time, the electroplating pad is attached to the substrate using a jig.

When the electroplating pad is used, since the seed layer formed to perform the electroplating process is not required. The step of forming the seed layer and the step of removing the seed layer on the substrate are not required.

(6) Step of planarizing a surface of the substrate

In this step, the top surface of the substrate is planarized. Specifically, the buried conductor excessively formed up to the upper portion of the through hole in the step of forming the buried conductor is removed to planarize the top surface of the substrate.

In addition, when buried conductor is formed using the electroplating pad, both of the top surface and the bottom surface of the substrate should be planarized.

(7) Step of forming the conductive film

In this step, the conductive film is formed on the top surface of the substrate. Specifically, a base conductive film made of a conductive material is formed on the top surface of the substrate. At that time, a material such as Al is used as the conductive material, the conductive material being formed using a deposition process.

In addition, since the conductive film can be made of any metal excellent in electrical characteristics, various metals can be used for the conductive film. However, if the metal to be used is replaced with other metal, the deposit condition is changed.

(8) Step of forming the first tip supporter

In this step, the first tip supporter of a truncated cone shape having an oblique surface sloping down is formed on the substrate provided with the base conductive film.

Specifically, the substrate is coated with the photo-resist having a predetermined thickness, and then the photo-resist is exposed by means of a three dimensional mirror reflected parallel beam illuminator and developed, so that the first tip supporter is formed.

(9) Step of rounding the first tip supporter

In this step, a part of the top surface of the first tip supporter is rounded. Specifically, angled parts of the top surface of the first tip supporter are removed by use of an ashing process using $O_2$ gas to form a curved surface.

(10) Step of forming the second tip supporter

In this step, the second tip supporter is formed in the outer surface of the first tip supporter. Specifically, a nitride film is formed on the top surface of the substrate provided with the first tip supporter, and then the photolithography process is carried out to the nitride film to open the top surface of the first tip supporter to form the second tip supporter.

When the second tip supporter has a thickness of several thousands Å, this step can be performed using a plasma enhanced chemical vapor deposition (PECVD) process. However, when the second tip supporter has a thickness of severak μm unit, this step can be performed using a low pressure chemical vapor deposition (LPCVD) process.

(11) Step of forming the tip

In this step, the tip made of a conductive material is formed on an outer surface of the second tip supporter. Specifically, the conductive film is formed on the substrate provided with the second tip supporter, and then the photolithography process is carried out to the conductive film to form the tip. At that time, the tip is formed to open the top surface of the second tip supporter, similarly to the second tip supporter.

The conductive film for forming the tip is made of any one of Cr, Ni and W, and the conductive film is formed using an LPCVD process or the like.

(12) Step of removing a part of the first tip supporter

In this step, the top surface of the exposed first tip supporter is removed by a predetermined depth. Specifically, this step is carried out by use of the ashing process using $O_2$ gas.

In addition, the hollow microprobe using the MEMS technique according to the present invention, comprises: a substrate in which a through hole having a predetermined size is formed on a defined portion thereof; a buried conductor being filling in the through hole; a base conductive film formed on the substrate in which the through hole is filled with the buried conductor; a first tip supporter formed on the conductive film, having a oblique surface sloping down, its top surface being rounded into a curve surface; a second tip supporter being formed on an outer surface of the first tip supporter, allowing the top surface of the first tip supporter to be opened and being protruded from the top of the first tip supporter; and a tip made of conductive materials having a shape capable of opening the upper portion of the first tip.

Now, the components of the hollow microprobe using the MEMS technique will be described in detail.

First, the buried conductor 18 is made of nickel (Ni).

Furthermore, the first tip supporter 22 is formed on the substrate provided with the base conductive film, into a shape of a truncated cone having an oblique surface sloping down. The first tip supporter 22 is mad of photo-resist or the like. However, the first tip supporter has a slow-curved surface by removing an upper portion of the truncated cone using the ashing process.

Furthermore, the second tip supporter 24 is formed on the substrate to be attached to an outer surface of the first tip supporter. At that time, the second tip supporter is made f a nitride film, and the top surface of the second tip supporter is opened to expose the top surface of the first tip supporter.

Furthermore, the tip 26 is formed on the substrate to be attached to the outer surface of the second tip supporter. The tip is formed to have a thickness more than that of the second tip supporter. The top surface of the tip is also opened so that the top surface of the first tip supporter exposed by the second tip supporter is exposed. At that time, the tip is made of any one of Cr, Ni, and W.

BRIEF DESCRIPTION OF THE DRAWINGS

Now, the preferred embodiments will be described in details with reference to the accompanying drawings in which.

BEST MODE FOR CARRYING OUT THE INVENTION

Now, preferred embodiments of the present invention will be described in detail with reference to the appended drawings.

FIGS. 2A to 2K are cross-sectional views illustrating a method of manufacturing the hollow microprobe using the MEMS technique according to one embodiment of the present invention.

Figure 1:
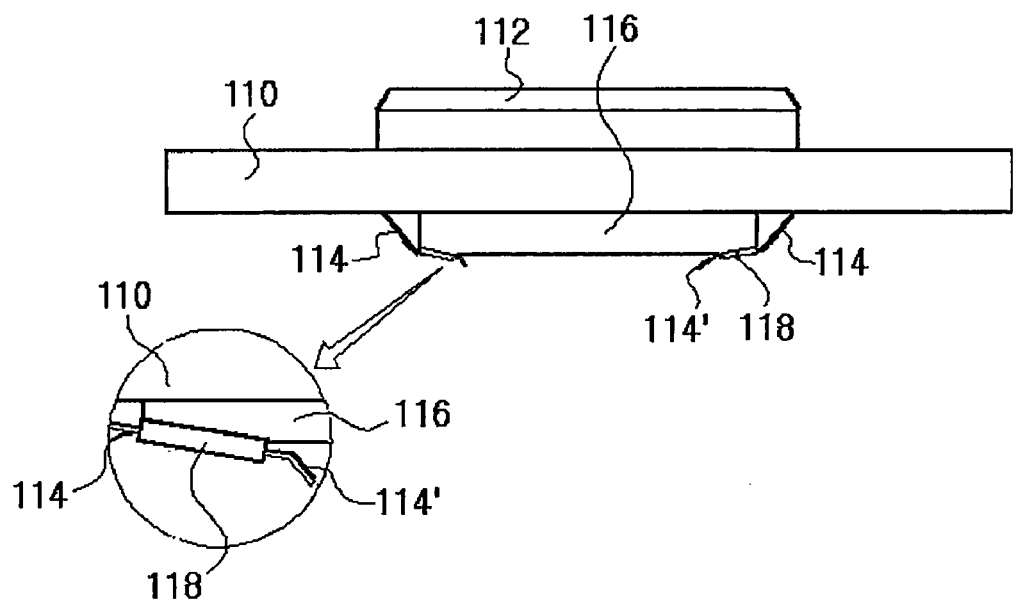
FIG. 1 is a cross-sectional view illustrating a probe card having conventional probe.
Figure 2A:
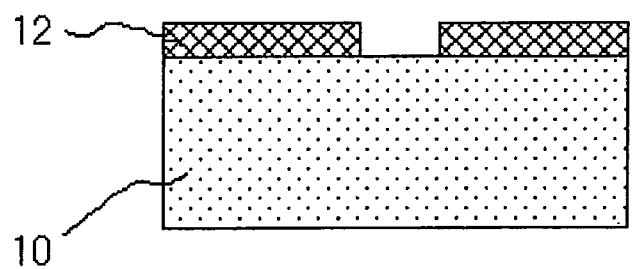
FIGS. 2A to 2K are cross-sectional views illustrating processes of a method of manufacturing a hollow microprobe using an MEMS technique according to an embodiment of the present invention.

In order to manufacture the hollow microprobe using the MEMS technique according to the present invention, first, a protection film pattern 12 is formed on a substrate 10 made of silicon or glass as shown in FIG. 2A.

At that time, a protection film pattern 12 is made of photo-resist excellent in a photosensitivity to light, and the protection film pattern 12 made of photo-resist is formed by coating the photo-resist on the whole surface of the substrate 10 using a spin-coating process, exposing the coated photo-resist to the light, and developing the exposed photo-resist.

At that time, it is preferable that the substrate has a thickness of about 500 μm and the photo-resist is formed to have a thickness of 10 μm. Since a selective etching ratio of the substrate to the photo-resist mask is 70:1 in a process using a deep RIE apparatus, if a wafer of 500 μm thickness is used, the photo-resist having a thickness from about 7 μm to about 8 μm is required, but if it is considered that the corner portion of the pattern is eroded and removed, it is suitable that the photo-resist has a thickness of 10 μm.

Figure 2B:
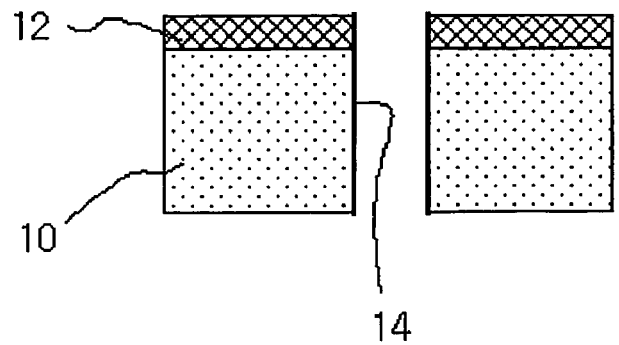

Next, a through hole 14 is formed in the predetermined portion of the substrate using a reactive ion etching (RIE) process or a laser process. In the RIE process, a deionized reaction gas is inter-reacted with the substrate 10 to etch the predetermined portion in which the protection film pattern on the substrate is removed using the protection film pattern 12 formed on the substrate 10 as a mask as shown in FIG. 2B. In the laser process, the laser beam is applied to the substrate 10.

At that time, when the through hole 14 is formed using a laser process, there is no need for the photo-resist pattern. Therefore, the step of forming the photo-resist and the step of removing the photo-resist can be omitted.

Figure 2C:
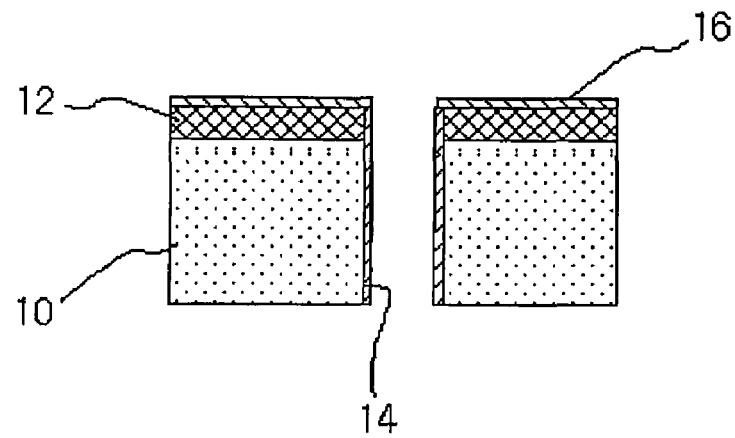

Then, as shown in FIG. 2C, a seed layer 16 made of chrome (Cr) is formed on the top surface of the protection film pattern 12 on the substrate 10 provided with the through hole 14 and on the inner wall of the through hole 14 by performing a sputtering process. Furthermore, the seed layer made of copper (Cu) may be formed.

At that time, the seed layer 16 performs a function of allowing a electroplating film to be effectively deposited in the subsequent electroplating process.

Figure 2D:
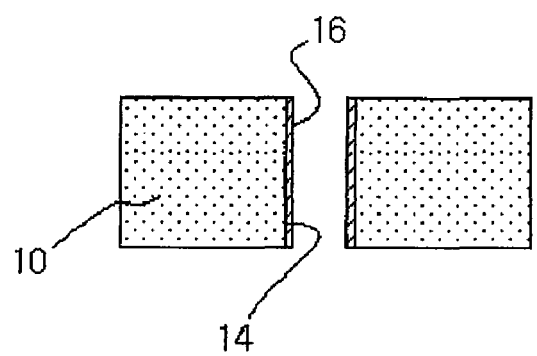

Next, as shown in FIG. 2D, the seed layer 16 and the protection film pattern 12 on the substrate 10 are removed.

At that time, the seed layer 16 and the protection film pattern 12 are removed by a wet etching process using chemicals.

In other words, the top surface of the substrate provided with the seed layer 16 and the protection film pattern 12 are dipped in the bath filled with the predetermined chemicals so that the protection film pattern 12 and the seed layer 16 on the protection film pattern 12 are concurrently removed. As a result, the seed layer 16 remains only in the through hole 14.

Figure 2E:
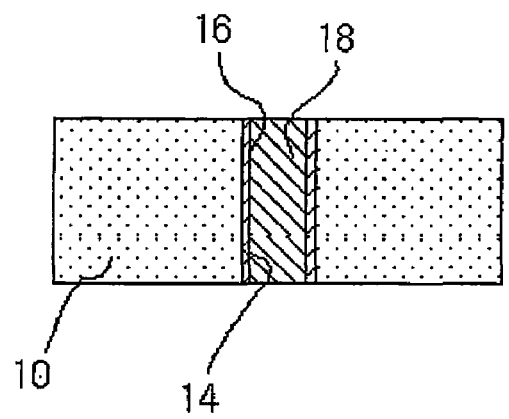

Next, as shown in FIG. 2E, the through hole 14 formed on the substrate 10 is buried with the buried conductor 18 made of Ni, using the seed layer by means of the electro plating process, and the Ni film having a predetermined thickness is formed on the top surface of the substrate.

Figure 5:
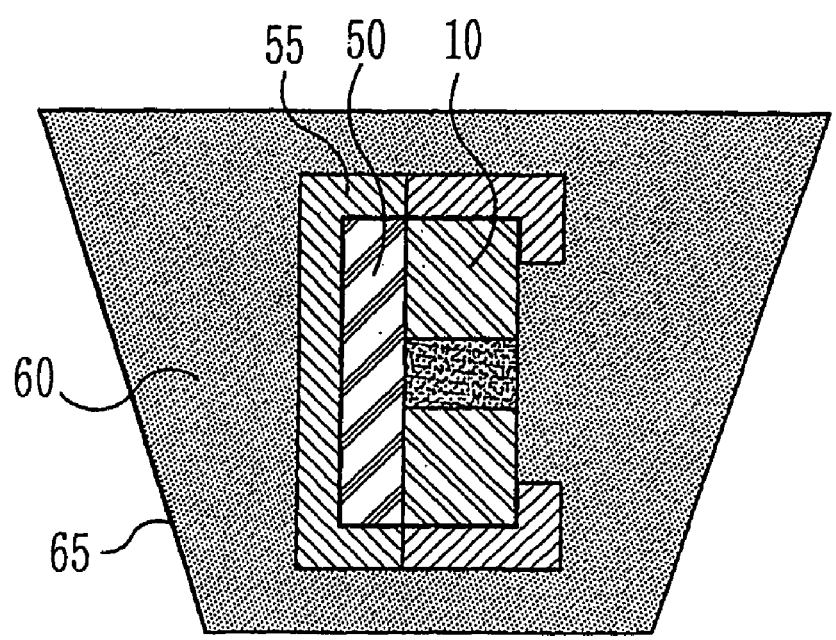
FIG. 5 is a cross-sectional view showing an electroplating pad attached to one surface of a substrate using a jig.

In addition, the step of forming the conductor can be also performed using an electroplating pad without using the seed layer. In other words, as shown in FIG. 5, the electroplating pad 50 is attached to one surface of the substrate 10 using a jig 55, and then the electroplating process is carried out thereto. Furthermore, if the electroplating process is completed, the electroplating pad 50 is removed from the substrate.

However, when using the electroplating pad, after the electroplating process is completed, a planarization process is carried out to both surfaces of the substrate 10.

The planarization process such as a chemical mechanical polishing (CMP) process is carried out to the top surface of the substrate 10 provided with the Ni film, so that the buried conductor 18 made of Ni remains only within the through hole 14 formed in the substrate 10. The remaining buried conductor excessively formed is removed to planarize the substrate 10.

Figure 2F:
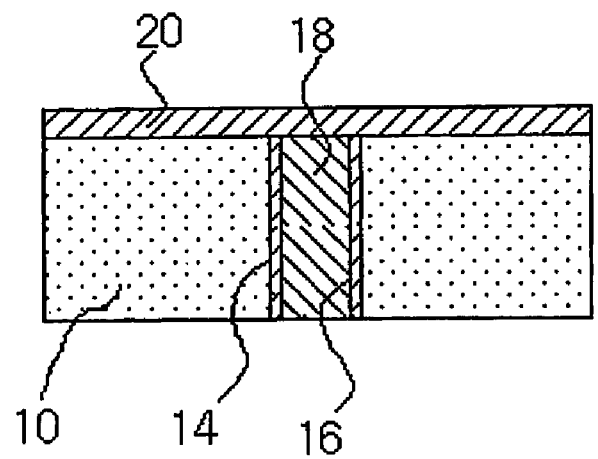

Next, as shown in FIG. 2F, the base conductive film 20 made of the conductive material such as Cr, Ni, and Al excellent in electrical characteristics is formed on the substrate 10 which is buried with the buried conductor 18 made of Ni.

At that time, the base conductive film 20 is formed using a physical vapor deposition process such as a sputtering process or the like. However, if the metal to be deposited is replaced with other metal, the depositing condition should be changed. In the aforementioned deposition process, Ar gas is used, and the work pressure during the process is preferably 2 mtorr.

Figure 2G:
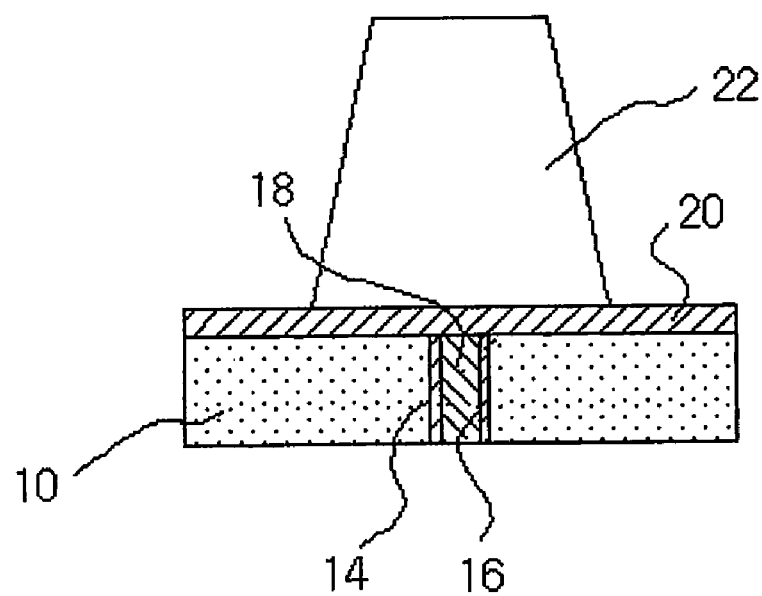

Next, as shown in FIG. 2G, the photo-resist having a predetermined thickness is coated on the substrate 10 provided with the base conductive film. Then, the photo-resist is exposed by means of the three dimensional mirror reflected parallel beam illuminator (MRPBI) and developed, so that a truncated cone shaped photo-resist pattern having an oblique surface sloping down, that is, the first tip supporter 22 is formed.

In other words, when the photo-resist is exposed by means of the three dimensional MRPBI, the photo-resist is exposed obliquely to form the first tip supporter. In order to form the slope of 20 degree, the photo-resist should be exposed obliquely by 35 degree.

In this case, the three dimensional MRPBI is disclosed in the Korean Patent Application number 2001-35359, entitled "A very-slow slope-turn exposure" and assigned to Korea Advanced Institute of Science and Technology (KAIST). when using the three dimensional MRPBI, the photo-resist pattern having the oblique surface sloping down can be formed. In other words, the first tip supporter 22 is formed by allowing the substrate to be obliquely placed on a stage by the predetermined sloped angle, and then applying obliquely the ultra violet ray to the photo-resist while turning the stage to expose the photo-resist. Next, the exposed photo-resist is developed by means of a developer.

Figure 2H:
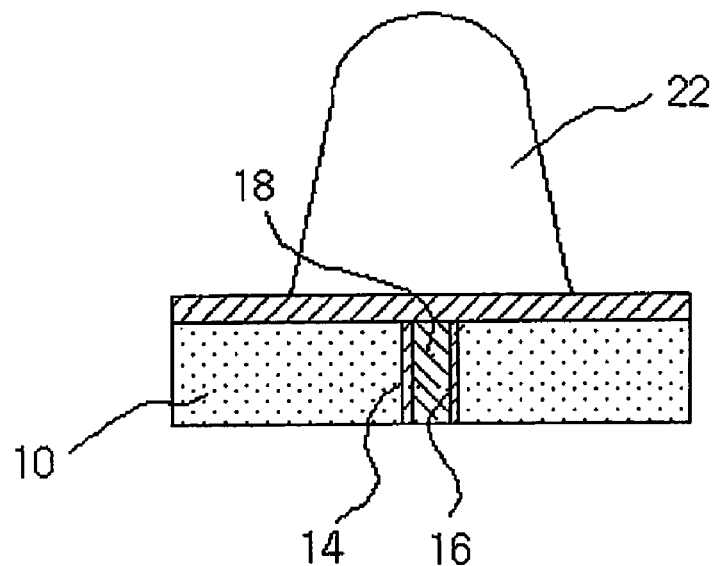

Next, as shown in FIG. 2H, the angled portion of the top surface of the first tip supporter 22 having the truncated cone shape is rounded into a curved surface through the ashing process.

At that time, in the ashing process, $O_2$ gas is ionized into a plasma state, the oxygen ion in the plasma state is allowed to react to the top surface of the first tip supporter 22, so that the angled portion of the top surface of the first tip supporter 22 is eroded and rounded. In the condition of the ashing process, it is preferable that oxygen ($O_2$) of 200 sccm is supplied and the pressure is 200 Pa.

Figure 2I:
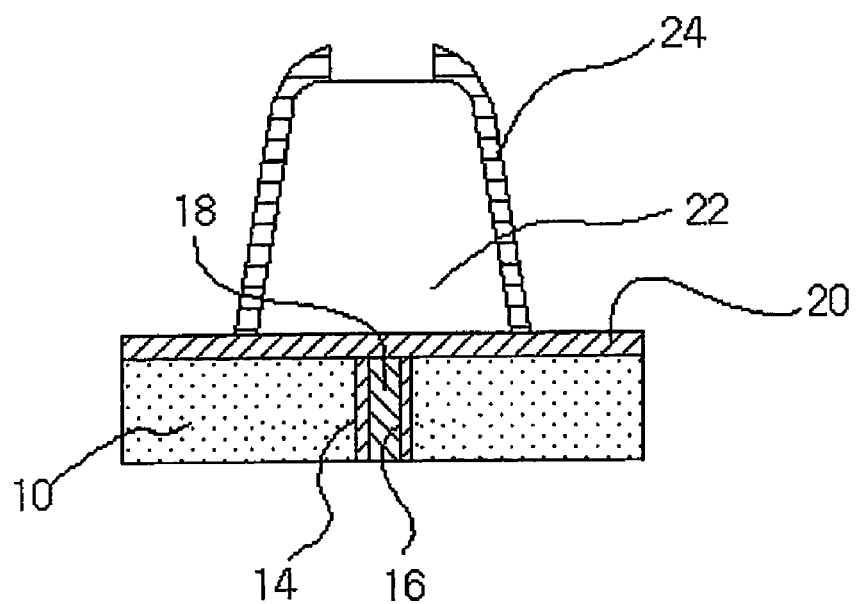

Next, as shown in FIG. 2I, a nitride film 24 made of nitride ($Si_3N_4$) is formed on the substrate 10 processed through the ashing process and the outer portion of the first tip supporter 22. Then, a predetermined portion of the nitride film 24 is removed by means of the conventional photolithography process so that the rounded portion of the first tip supporter 22 is exposed whereby the nitride film pattern provided with an opening, that is, the second tip supporter 24 is formed.

In other words, for the second tip supporter 24, the photo-resist is coated over the whole nitride film formed on the outer surface of the first tip supporter 22 of which the top surface is rounded, and is exposed and developed to form the photo-resist pattern. Then, using the photo-resist pattern as a mask, its under film, that is, the nitride film 24 is etched through the reactive ion etching (RIE) process, so that the second tip supporter 24 is completed.

At that time, as a method of forming the nitride film 24, when the nitride film has a thickness of several thousands Å, it is preferable that the PECVD process is used, but when the nitride film has a thickness of several μm, it is preferable that the LPCVD process is used. In this embodiment, the nitride film has a thickness of about 1 to 20 μm. Furthermore, the nitride film may be formed through an electroplating process.

Figure 2J:
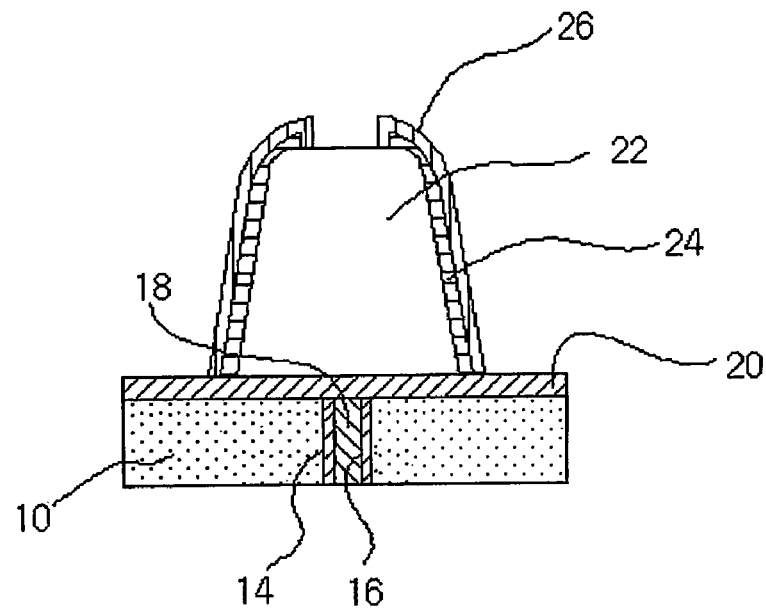

Next, as shown in FIG. 2J, a metal film made of Cr or Ni is formed by means of the sputtering process on the substrate 10 on witch the second tip supporter 24 is formed through the RIE process, or a metal film made of tungsten (W) is formed by means of a metal organic chemical vapor deposition (MOCVD), and then the metal film pattern, that is, a tip 26 is formed on the outer surface of the second tip supporter 24 by means of the conventional photolithography process.

In other words, first, the metal film is formed, the photo-resist is coated over the whole outer surface of the metal film and then the photo-resist is exposed and developed to form the photo-resist pattern, and its under film, that is, the metal film 26 is etched by the RIE method using the photo-resist pattern as a mask to form the tip 26. At that time, the metal has a thickness of from about 10 μm to about 30 μm. As a metal film forming method, the electroplating process or the deposition process is available.

Figure 2K:
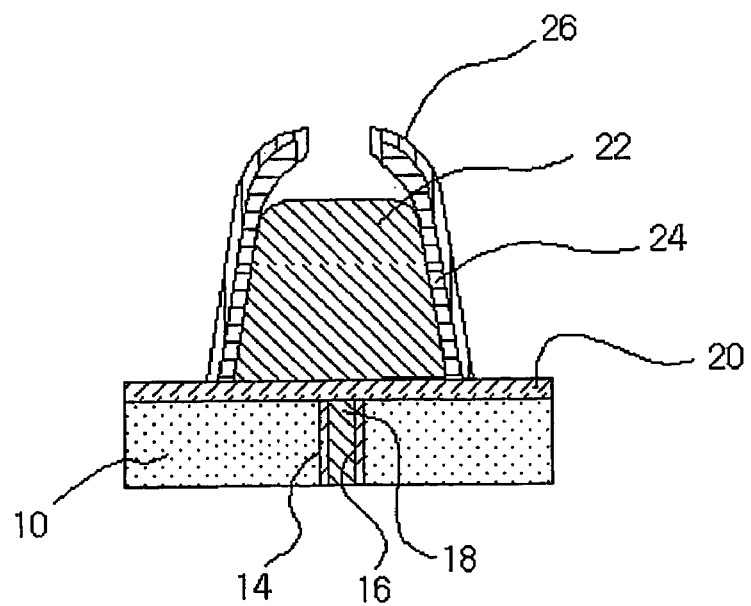

Finally, as shown in FIG. 2K, a part of top surface of the first tip supporter is removed by the ashing process.

In other words, in this embodiment, the nitride film pattern, which is the photo-resist under the second tip supporter 24, that is, the first tip supporter 22 is etched and removed by a predetermined depth. If the etching process is completed, the hollow probe according to the present invention is completed.

Now, a method of using the hollow probe according to the present invention will be described. FIGS. 3A, 3B, 4A, and 4B are cross-sectional views showing a method of using the hollow probe according to the present invention.

Figure 3A:
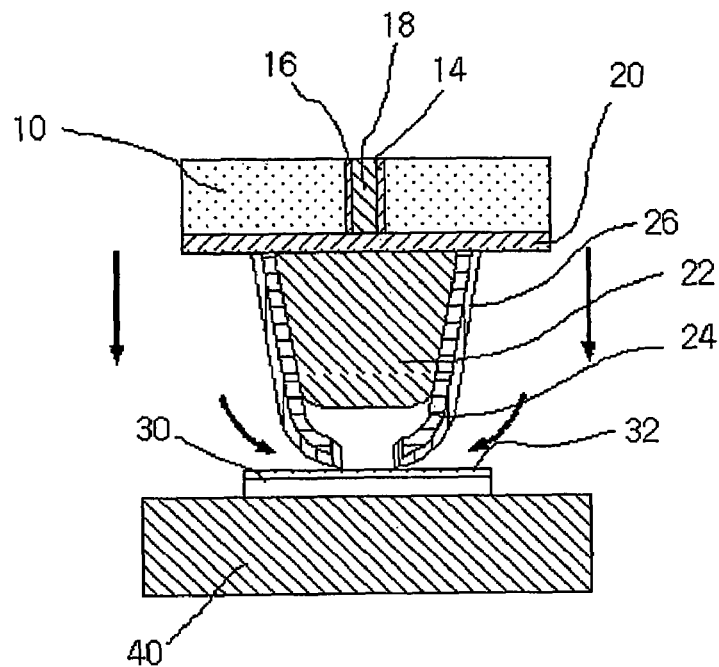
FIGS. 3A and 3B are cross-sectional views illustrating a contact state between the hollow microprobe according to the embodiment of the present invention and a plane type electrode pad.
Figure 3B:
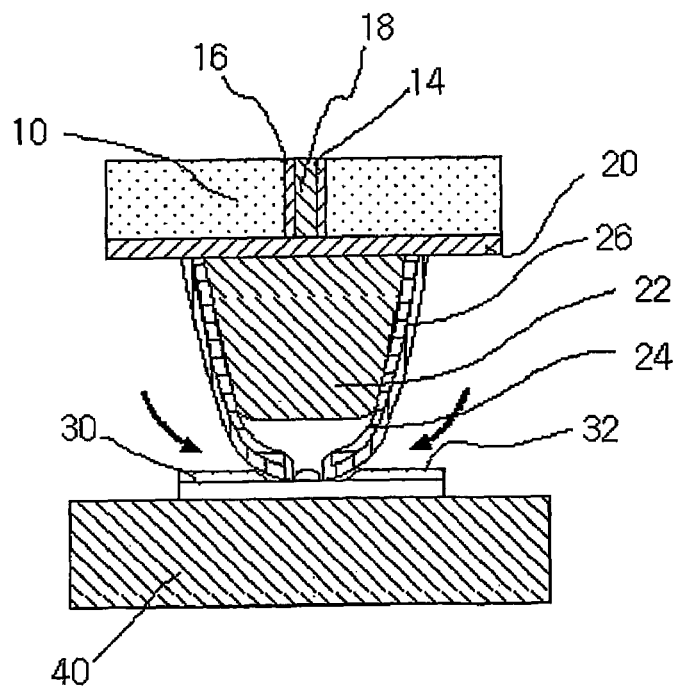

First, as shown in FIG. 3A, when the hollow probe according to the present invention moves from up to down on the substrate 40 which a plane type electrode pad 30 is provided on by the predetermined physical force F, the hollow probe according to the present invention allows the conductive tip 26 supported by the first tip supporter 22 and the second tip supporter 24 to slightly shrink, and then as shown in FIG. 3B, the tip penetrates the thin oxide film 32 formed on the surface of the electrode pad 30 to come in contact with the plane type electrode pad 30.

At that time, the first tip supporter 22 performs a function of preventing the portions corresponding to each other in the tip 26 from contacting each other due to the excessive shrink of the tip 26, and the second tip supporter 24 performs a function of supporting the tip 26.

Figure 4A:
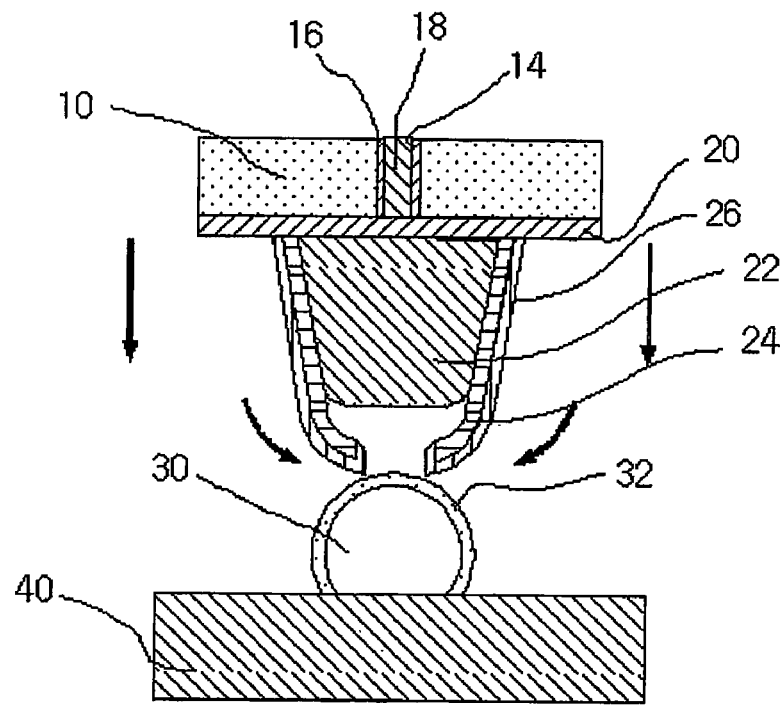
FIGS. 4a and 4b are cross-sectional views illustrating a contact state between the hollow microprobe using the MEMS technique according to the embodiment of the present invention and a ball type electrode pad.
Figure 4B:
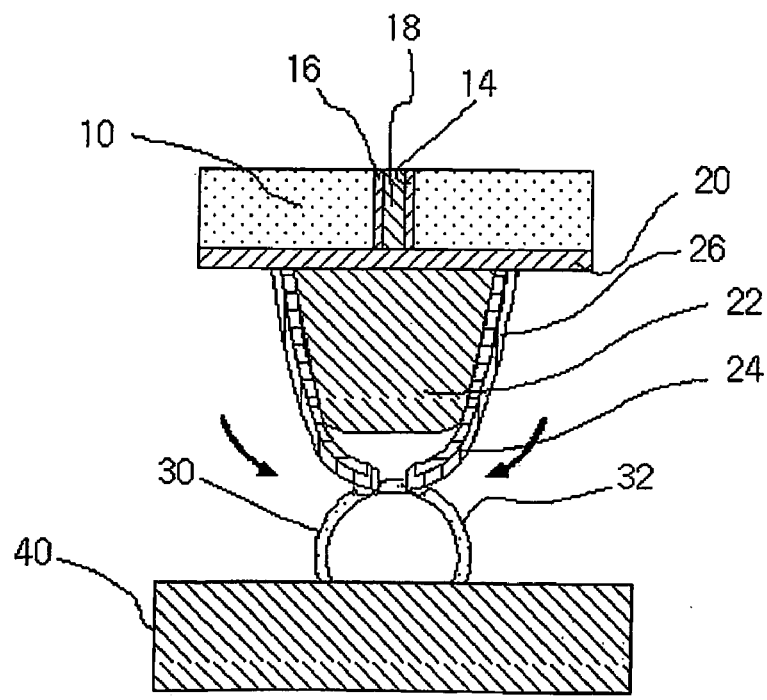

In addition, as shown in FIG. 4A, when the substrate 40 provided with the ball type electrode pad 30 of which the top surface is curved moves from up to down by the predetermined physical force F, the aforementioned hollow probe according to the present invention allows the conductive tip 26 supported by the first tip supporter 22 and the second tip supporter to slightly shrink, and then as shown in FIG. 4*b*, the conductive tip penetrates the thin oxide film 32 formed on the surface of the electrode pad 30 to come in contact with the ball type electrode pad 30.

At that time, the tip 26 of the hollow probe according to the present invention is contacted with the electrode pad 30 in the form of surrounding the ball type electrode pad 30, so that the tip 26 is prevented from sliding on the top surface of the ball type electrode pad 30.

Specifically, since the hollow probe according to the present invention can be vertically attached to the space expander or the like, the hollow probe can cope with the fine pitch of the highly integrated semiconductor element.

Since the hollow microprobe according to the present invention can be vertically attached to the space expander of the probe card with highly-density, it is possible to cope with the fine pitch of the highly integrated semiconductor element.

Furthermore, since the microprobe according to the present invention comes in contact with the ball type electrode pad widely used in recent years, that is, the ball type electrode pad of which the top surface is protruded upwardly, in the form of surrounding the ball type electrode pad, it is possible to increase an area in which the end of the microprobe comes in contact with the ball type electrode pad, and thus to prevent the end of the microprobe from sliding on the ball type electrode pad, thereby facilitating its use.

In addition, since the hollow microprobe according to the present invention makes it possible to mass-produce reproducible product using the MEMS technique, it is possible to solve the problems such as the lack of reproducibility, no-unification of standards or the like.

Although the present invention has been described in detail in connection with the preferred embodiments, the preferred embodiments are intended not to limit the present invention but to exemplify best modes of the present invention. It will be understood by those skilled in the art that various changes or modifications may be made thereto without departing from the spirit and scope of the present invention. Therefore, the present invention is defined only by the appended claims which should be construed as covering such changes or modifications.

What is claimed is:

1. A method of manufacturing a hollow microprobe using an MEMS technique, comprising:
   a step of forming a through hole 14 in a substrate 10;
   a step of forming a buried conductor 18 in the through hole 14;
   a step of planarizing a surface of the substrate 10 provided with the buried conductor 18;
   a step of forming a base conductive film 20 on the substrate 10;
   a step of forming a first tip supporter 22, which has a oblique surface sloping down, on the substrate 10 provided with the base conductive film 20;
   a step of rounding the top surface of the first tip supporter 22 by eroding angled portions of the top surface of the first tip supporter 22;
   a step of forming a second tip supporter 24 on an outer surface of the first tip supporter 22 to allow the top surface of the first tip supporter 22 to be opened;
   a step of forming a tip 26 on the outer surface of the second tip supporter 24; and
   a step of removing a part of the top surface of the first tip supporter 22 opened by the second tip supporter and the tip by a predetermined depth.

2. A method of manufacturing a hollow microprobe using an MEMS technique according to claim 1, further comprising a step of forming a protection film pattern 12 on the substrate 10, before the step of forming the through hole.

3. A method of manufacturing a hollow microprobe using an MEMS technique according to claim 2, wherein the protection film pattern has a thickness of 10±2 μm.

4. A method of manufacturing a hollow microprobe using an MEMS technique according to claim 2, wherein in the step of forming the through hole, the through hole is formed by punching the substrate 10 using the protection film pattern 12 as a mask in a reactive ion etching (RIE) process.

5. A method of manufacturing a hollow microprobe using an MEMS technique according to claim 1, wherein in the step of forming the through hole, the through hole is formed by applying a laser beam to the substrate 10 from an upside of the substrate to punch the substrate 10.

6. A method of manufacturing a hollow microprobe using an MEMS technique according to claim 1, wherein the substrate is made of either silicon or glass.

7. A method of manufacturing a hollow microprobe using an MEMS technique according to claim 1, further comprising a step of forming a seed layer on an inner surface of the through hole and a top surface of the substrate, before the step of forming the buried conductor.

8. A method of manufacturing a hollow microprobe using an MEMS technique according to claim 7, wherein the seed layer is formed using a sputtering process.

9. A method of manufacturing a hollow microprobe using an MEMS technique according to claim 7, wherein the seed layer is made of copper (Cu).

10. A method of manufacturing a hollow microprobe using an MEMS technique according to claim 7, wherein the seed layer is made of chrome (Cr).

11. A method of manufacturing a hollow microprobe using an MEMS technique according to claim 7, further comprising a step of removing the seed layer and the protection film pattern on the substrate, so that the seed layer remains only on the inner wall of the though hole.

12. A method of manufacturing a hollow microprobe using an MEMS technique according to claim 11, wherein the step of removing the seed layer and the protection film pattern is carried out using a wet etching process.

13. A method of manufacturing a hollow microprobe using an MEMS technique according to claim 1, wherein the buried conductor is formed by performing an electroplating process using the seed layer.

14. A method of manufacturing a hollow microprobe using an MEMS technique according to claim 1, wherein the buried conductor is formed by performing an electroplating process using an electroplating pad.

15. A method of manufacturing a hollow microprobe using an MEMS technique according to claim 14, wherein the electroplating pad is coupled to the substrate using a jig.

16. A method of manufacturing a hollow microprobe using an MEMS technique according to claim 1, wherein the buried conductor is made of nickel (Ni).

17. A method of manufacturing a hollow microprobe using an MEMS technique according to claim 1, wherein the step of planarzing the surface of the substrate is performed using a chemical mechanical polishing (CMP) process.

18. A method of manufacturing a hollow microprobe using an MEMS technique, according to the claim 1, wherein the step of forming the base conductive film is carried out using a physical deposition process.

19. A method of manufacturing a hollow microprobe using an MEMS technique according to claim 1, wherein the base conductive film is made of aluminum (Al).

20. A method of manufacturing a hollow microprobe using an MEMS technique according to claim 1, wherein in the step of forming the first tip supporter, the first tip supporter is formed by coating photo-resist on the substrate with a predetermined thickness and obliquely exposing the photo-resist by means of a three dimensional mirror reflected parallel beam illuminator (MRPBI).

21. A method of manufacturing a hollow microprobe using an MEMS technique according to claim 1, wherein the step of rounding the top surface of the first tip supporter is carried out using a plasma including oxygen (O$_2$) gas.

22. A method of manufacturing a hollow microprobe using an MEMS technique according to claim 1, wherein the step of forming the second tip supporter is carried out using a low pressure chemical vapor deposition (LPCVD) process.

23. A method of manufacturing a hollow microprobe using an MEMS technique according to claim 1, wherein the step of forming the second tip supporter is carried out using a plasma enhanced chemical vapor deposition (PECVD) process.

24. A method of manufacturing a hollow microprobe using an MEMS technique according to claim 1, wherein the second tip supporter is made of a nitride film (Si$_3$N$_4$).

25. A method of manufacturing a hollow microprobe using an MEMS technique according to claim 1, wherein the second tip supporter has a thickness of 1 to 20 μm.

26. A method of manufacturing a hollow microprobe using an MEMS technique according to claim 1, wherein in the step of forming the tip, the conductive film is formed using a metal organic chemical vapor deposition (MOCVD) process.

27. A method of manufacturing a hollow microprobe using an MEMS technique according to claim 1, wherein in the step of forming the tip, a conductive film is formed using a sputtering process.

28. A method of manufacturing a hollow microprobe using an MEMS technique according to claim 1, wherein a predetermined part of the tip is removed using a photolithography process.

29. A method of manufacturing a hollow microprobe using an MEMS technique according to claim 1, wherein the tip is made of any one of chrome (Cr), nickel (Ni), and tungsten (W).

30. A method of manufacturing a hollow microprobe using an MEMS technique according to claim 1, wherein the tip has a thickness of 10 to 30 μm.

31. A method of manufacturing a hollow microprobe using an MEMS technique according to claim 1, wherein the step of removing a part of the first tip supporter is carried out by use of an ashing process using oxygen (O$_2$) gas.

32. A hollow microprobe using an MEMS technique, comprising:
   a substrate in which a through hole having a predetermined size is formed on a defined portion;
   a buried conductor filling in the through hole;
   a base conductive film formed on the substrate in which the through hole is filled with the buried conductor;
   a first tip supporter formed on the base conductive film and having a oblique surface sloping down, its top surface being rounded into a curved surface; a second tip supporter being formed on an outer surface of the first tip supporter, allowing the top surface of the first tip supporter to be opened, and being protruded from the top of the first tip supporter; and
   a conductive tip being formed on an outer surface of the second tip supporter and allowing the top surface of the first tip supporter to be opened.

33. A hollow microprobe using an MEMS technique according to claim 32, wherein the buried conductor 18 is made of nickel (Ni).

34. A hollow microprobe using an MEMS technique according to claim 32, wherein the tip 26 is made of any one of chrome (Cr), nickel (Ni), and tungsten (W).

35. A hollow microprobe using an MEMS technique according to claim 32, wherein the substrate 10 is made of silicon or glass.

36. A hollow microprobe using an MEMS technique according to claim 32, wherein the second tip supporter has a thickness of 1 to 20 μm.

37. A hollow microprobe using an MEMS technique according to claim 32, wherein the conductive film has a thickness of 10 to 30 μm.

* * * * *

UNITED STATES PATENT AND TRADEMARK OFFICE
CERTIFICATE OF CORRECTION

PATENT NO. : 7,119,557 B2
APPLICATION NO. : 10/527359
DATED : October 10, 2006
INVENTOR(S) : Lee It is certified that error appears in the above-identified patent and that said Letters Patent is hereby corrected as shown below:

Title page, item [73]
Assignee, delete "Philcom Corporation" and replace with --Phicom Corporation--.

Signed and Sealed this

Thirtieth Day of January, 2007

JON W. DUDAS
*Director of the United States Patent and Trademark Office*